(12) United States Patent
Lamesch

(10) Patent No.: US 11,050,422 B2
(45) Date of Patent: Jun. 29, 2021

(54) DIAGNOSTICS FOR CAPACITIVE SENSOR

(71) Applicant: IEE INTERNATIONAL ELECTRONICS & ENGINEERING S.A., Echternach (LU)

(72) Inventor: Laurent Lamesch, Reichlange (LU)

(73) Assignee: IEE INTERNATIONAL ELECTRONICS & ENGINEERING S.A., Echternach (FR)

( * ) Notice: Subject to any disclaimer, the term of this patent is extended or adjusted under 35 U.S.C. 154(b) by 0 days.

(21) Appl. No.: 16/968,577

(22) PCT Filed: Feb. 7, 2019

(86) PCT No.: PCT/EP2019/053017
§ 371 (c)(1),
(2) Date: Aug. 8, 2020

(87) PCT Pub. No.: WO2019/154914
PCT Pub. Date: Aug. 15, 2019

(65) Prior Publication Data
US 2021/0013882 A1    Jan. 14, 2021

(30) Foreign Application Priority Data

Feb. 8, 2018    (LU) .................................. LU100699
Mar. 20, 2018    (LU) .................................. LU100737

(51) Int. Cl.
*H03K 17/955* (2006.01)
*G01D 5/24* (2006.01)

(52) U.S. Cl.
CPC ............. *H03K 17/955* (2013.01); *G01D 5/24* (2013.01)

(58) Field of Classification Search
USPC ................. 324/658, 660–663, 679, 681, 686
See application file for complete search history.

(56) References Cited

U.S. PATENT DOCUMENTS 8,354,936 B2    1/2013    Ootaka
2010/0315234 A1*    12/2010    Ootaka .................. B60N 2/002
340/561

(Continued)

FOREIGN PATENT DOCUMENTS

| JP | 2007051930 A | 3/2007 |
| WO | WO2016055667 A1 | 4/2016 |
| WO | WO2017129552 A1 | 8/2017 |

OTHER PUBLICATIONS

International Search Report corresponding to International Application No. PCT/EP2019/053017, dated Apr. 17, 2019, 3 pages.

(Continued)

*Primary Examiner* — Vincent Q Nguyen
(74) *Attorney, Agent, or Firm* — Reising Ethington P.C.

(57) ABSTRACT

A capacitance measurement circuit for determining a complex electric current of at least one capacitive sense-guard sensor. The circuit includes an alternating signal voltage source, wherein each guard electrode is electrically connectable to the signal voltage source, a current measurement circuit having at least one measurement channel to determine a measurement current through a sense electrode, and at least one diagnostics channel to determine, with reference to an AC ground potential, a diagnostic current flowing through a guard electrode and a sense electrode of a capacitive sensor, and a remotely controllable switching unit, which in a measurement switching state is configured to electrically connect the sense electrode of the capacitive sensor to the measurement channel, and in a diagnostic switching state is configured to electrically connect the sense electrode to the diagnostics channel.

16 Claims, 6 Drawing Sheets

(56) References Cited

U.S. PATENT DOCUMENTS

2013/0207677 A1 8/2013 Togura
2017/0305376 A1 10/2017 Lamesch
2019/0047502 A1 2/2019 Lamesch

OTHER PUBLICATIONS

Written Opinion corresponding to International Application No. PCT/EP2019/053017, dated Apr. 17, 2019, 7 pages.
J. Smith et al., "Electric Field Sensing for Graphical Interfaces", IEEE Computer Graphics and Applications, vol. 18 No. 3, dated May/Jun. 1998, pp. 54-60.

* cited by examiner

DIAGNOSTICS FOR CAPACITIVE SENSOR

TECHNICAL FIELD

The invention relates to a capacitance measurement circuit for determining a complex electric current of at least one capacitive sensor, to a capacitive sensing system comprising such capacitance measurement circuit, to a method of operating such capacitive sensing systems with regard to capacitive sensor diagnosis, and to a software module for controlling automatic execution of such method.

BACKGROUND

Capacitive measurement and/or detection systems have a wide range of applications, and are among others widely used for the detection of the presence and/or the position of a conductive body in the vicinity of an electrode of the system. A capacitive sensor, called by some electric field sensor or proximity sensor, designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon establishes an electric field into a region of space proximate to the antenna electrode, while the sensor is operating. The sensor comprises at least one sensing electrode—which could comprise the one or more antenna electrodes themselves—at which the influence of an object or living being on the electric field is detected.

The different capacitive sensing mechanisms are, for instance, explained in the technical paper entitled "Electric Field Sensing for Graphical Interfaces" by J. R. Smith et al., published in IEEE Computer Graphics and Applications, 18(3): 54-60, 1998. The paper describes the concept of electric field sensing as used for making non-contact three-dimensional position measurements, and more particularly for sensing the position of a human hand for purposes of providing three-dimensional positional inputs to a computer. Within the general concept of capacitive sensing, the author distinguishes between distinct mechanisms he refers to as "loading mode", "shunt mode", and "transmit mode", which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", which is alternatively referred to as "coupling mode", an oscillating voltage signal is applied to the transmit electrode, building up an electric field to a receive electrode, and the displacement current induced at the receive electrode is measured, whereby the displacement current may be modified by the body being sensed. In the "transmit mode", the transmit electrode is put in contact with the user's body, which then becomes a transmitter relative to a receiver, either by direct electrical connection or via capacitive coupling.

The capacitive coupling is generally determined by applying an alternating voltage signal to a capacitive antenna electrode and by measuring the current flowing from the antenna electrode either towards ground (in the loading mode) or into the second electrode (receiving electrode) in case of the coupling mode. This current is usually measured by means of a transimpedance amplifier, which is connected to the sensing electrode and which converts a current flowing into said sensing electrode into a voltage, which is proportional to the current flowing into the antenna electrode.

Some capacitive sensors are designed as sense-only capacitive sensors having a single sense electrode. Also, quite often capacitive sensors are used that comprise a sense electrode and a guard electrode that are arranged close to each other and are mutually insulated from each other. This technique of "guarding" is well known in the art and is frequently used for intentionally masking, and thus shaping, a sensitivity regime of a capacitive sensor. To this end, the guard electrode is kept at the same electric AC potential as the sense electrode. As a result, a space between the sense electrode and the guard electrode is free of an electric field, and the guard-sense capacitive sensor is insensitive in a direction between the sense electrode and the guard electrode.

By way of example, patent document U.S. Pat. No. 8,354,936 B2 describes a capacitive passenger detector for a vehicle. The capacitive passenger detector includes a main electrode, a sub-electrode and a guard electrode. The main electrode and the sub-electrode are separated apart from each other, and disposed in a seat of a vehicle. The guard electrode is disposed between the main electrode and a body of the vehicle, and separated apart from the main electrode. A sensitive characteristic measurement unit is configured for applying an alternating voltage signal to the main electrode, the sub-electrode and the guard electrode selectively or totally and for converting a current generated in the main electrode, the sub-electrode and the guard electrode to a voltage, respectively. The capacitive passenger detector further comprises a controller that defines a current flowing through the guard electrode to be a reference current when a voltage of the main electrode and a voltage of the guard electrode have the same potential. The controller defines a current flowing direction of the current flowing through the guard electrode to be a negative direction when the voltage of the main electrode is higher than the voltage of the guard electrode. The controller defines the current flowing direction of the current flowing through the guard electrode to be a positive direction when the voltage of the main electrode is lower than the voltage of the guard electrode. The controller corrects the voltage of the main electrode based on the current flowing through the guard electrode so that a corrected voltage of the main electrode is set to be a passenger determination data. Even when a potential difference is generated between the main electrode and the guard electrode, the controller detects the capacitance of the passenger correctly.

Capacitive sensing systems which are used in the control of airbag systems or other safety-related applications may be considered as safety-relevant system components. It may thus be necessary to monitor the good functioning of the different components of the sensor (sensing electrode and/or guard electrode) in order to rule out a false reading by the capacitive occupancy or proximity detection system.

It has been proposed in the prior art to furnish capacitive measurement circuits with diagnostic means for detecting a capacitive sensor interruption, in particular a guard electrode interruption.

For instance, international application WO 2017/129552 A1 describes a capacitance measurement circuit for determining a sense current of a capacitive sensor with a sense electrode and a guard electrode. The capacitance measurement circuit comprises a periodic signal voltage source, a sense current measurement circuit configured for determining the sense current with reference to a reference voltage and at least one remotely controllable switch member. The configuration is such that in the first switching state, the at least one switch member electrically connects the sense current measurement circuit to the periodic measurement voltage for providing a first reference voltage, and in the second switching state, the at least one switch member electrically connects the sense current measurement circuit to a second reference voltage that is different from the first reference voltage. By intentionally changing the reference voltage used for determining the sense current by connecting the sense current measurement circuit to the second reference voltage that is different from the first reference voltage, a signal can be generated by the sense current measurement circuit that can be indicative of an electrical interruption, wherein the interruption may include any interruption of electrical connections between the respective sense and guard cabling and connecting members.

SUMMARY

It is therefore an object of the present invention to provide an improved and as comprehensive as possible diagnostic concept for a capacitive sensing system, in particular for use in automotive applications, that is particularly suitable for multichannel capacitive sensing systems and that can be realized with low hardware effort and at moderate costs.

In one aspect of the present invention, the object may be achieved by a capacitance measurement circuit for determining a complex electric current of at least one capacitive sensor including at least one electrically conductive sense electrode and at least one electrically conductive guard electrode that are arranged close to each other. The at least one electrically conductive sense electrode and at least one electrically conductive guard electrode may e.g. be mutually galvanically separated from each other. However this is not a requirement. For example, a resistive connection between sense and guard electrodes can be used for diagnostics purpose.

The capacitance measurement circuit comprises at least one alternating signal voltage source, a current measurement circuit and a remotely controllable switching unit.

The at least one alternating signal voltage source is configured for providing an alternating measurement voltage at an output port, wherein each guard electrode is electrically connectable to the output port for receiving the alternating measurement voltage.

The current measurement circuit comprises at least one measurement channel and at least one diagnostics channel. The at least one measurement channel includes a measurement current-to-voltage converter that is configured to determine, with reference to the alternating measurement voltage, a measurement current through a sense electrode that is indicative of a position of an object relative to the capacitive sensor. The at least one diagnostics channel includes a diagnostics current-to-voltage converter that is configured to determine, with reference to an AC ground potential (alternating current ground potential), a diagnostic current flowing through a guard electrode and a sense electrode of a capacitive sensor that is connected to the diagnostics current-to-voltage converter.

The remotely controllable switching unit comprises, for each capacitive sensor, a plurality of operatively coupled switching members. In a measurement switching state with regard to the capacitive sensor, the switching unit is configured to electrically connect the sense electrode of the capacitive sensor to a signal input port of the measurement current-to-voltage converter of one of the at least one measurement channel. In a diagnostic switching state with regard to the capacitive sensor, the switching unit is configured to electrically connect the sense electrode to a signal input port of the diagnostics current-to-voltage converter of one of the at least one measurement channel. In the diagnostic switching state, the sense electrode is unconnected to the measurement current-to-voltage converter. In the measurement switching state, the sense electrode is unconnected to the diagnostics current-to-voltage converter.

One advantage of the proposed capacitance measurement circuit is that means are provided to diagnose the capacitive sensor and sensor wiring by measuring the complex sense-to-guard impedance of the capacitive sensor.

Another advantage is that an AC ground connection of the capacitive sensor can be diagnosed by the proposed capacitance measurement circuit when the sense electrode is connected to the signal input port of a diagnostics current-to-voltage converter.

When a capacitive sensor is not used for determining a measurement current through its sense electrode that is indicative of a position of an object relative to the capacitive sensor, an AC potential can be kept at or close to AC ground potential, which can be advantageous under certain circumstances.

The term "configured", as used in this application, shall in particular be understood as being specifically programmed, laid out, furnished or arranged. The phrase "operatively coupled switching members", as used in this application, shall in particular be understood as switching members that are configured to essentially change their switching states simultaneously.

Preferably, the at least one capacitive sensor is configured for being operated in loading mode.

The proposed capacitance measurement circuit is advantageously applicable particularly in vehicles. The term "vehicle", as used in this application, shall particularly be understood to encompass passenger cars, trucks, tractor units and buses.

Preferably, the measurement current-to-voltage converter and/or the diagnostics current-to-voltage converter comprise a transimpedance amplifier (TIA) whose function is to convert a current provided at a signal input port into an output voltage that is proportional to the determined current. A TIA is configured to convert the input current with reference to a reference voltage that is provided to a reference input port. Preferably, the transimpedance amplifier is based on one or more operational amplifiers.

In preferred embodiments, the capacitance measurement circuit is configured to generate an output signal that is indicative of a sensor interruption if the magnitude of a determined diagnostic current flowing through a sense electrode and a guard electrode of a capacitive sensor that is connected to the diagnostics current-to-voltage converter is less than a predefined threshold value. The output signal can beneficially be transferred, for instance to a higher-ranking control unit of a vehicle, for initiating further action.

Preferably, for each capacitive sensor,
a first switching member of said plurality of operatively coupled switching members is configured to, in the measurement switching state with regard to the capacitive sensor, electrically connect the sense electrode of the capacitive sensor to the signal input port of the measurement current-to-voltage converter;
a second switching member of said plurality of operatively coupled switching members is configured to, in the diagnostic switching state with regard to the capacitive sensor, electrically connect the sense electrode to the signal input port of the diagnostics current-to-voltage converter, said second switching member comprising a first terminal and a second terminal, wherein, in the diagnostic switching state with regard to the capacitive sensor, the first terminal of said second switching member is operatively coupled to the sense electrode and said second terminal of said second switching member is operatively coupled to the signal input port of the diagnostics current-to-voltage converter, and said switching unit comprises a demultiplexer member that is configured, in the measurement switching state with regard to a respective capacitive sensor, to connect the second terminal of the second switching member to guard potential of the respective capacitive sensor, i.e. to potential of a guard electrode potential of a guard electrode. By that, the second terminal of the second switching member, which is in an open switching position when the capacitive sensor is in a measurement switching state, can be kept at the electric potential of the guard electrode. Thus, a parasitic capacitance of the switching member can virtually be reduced to zero, and a measurement error due to parasitic capacitance of the switching member can be minimized.

In preferred embodiments of the capacitance measurement circuit, for each capacitive sensor, a first switching member of said plurality of operatively coupled switching members is configured to, in the measurement switching state with regard to the capacitive sensor, electrically connect the sense electrode of the capacitive sensor to the signal input port of the measurement current-to-voltage converter;

a second switching member of said plurality of operatively coupled switching members is configured to, in the diagnostic switching state with regard to the capacitive sensor, electrically connect the sense electrode to the signal input port of the diagnostics current-to-voltage converter, said second switching member comprising a first terminal and a second terminal, wherein, in the diagnostic switching state with regard to the capacitive sensor, the first terminal of said second switching member is operatively coupled to the sense electrode and said second terminal of said second switching member is operatively coupled to the signal input port of the diagnostics current-to-voltage converter, and said switching unit comprises a demultiplexer member that is configured to, in a measurement switching state with regard to a respective capacitive sensor, connect said second terminal of said second switching member to guard potential of the respective capacitive sensor.

Further, the demultiplexer member provided in the switching unit is configured, for each capacitive sensor whose sense electrode is unconnected to a measurement current-to-voltage converter, to either connect said second terminal of said second switching member to guard potential of the capacitive sensor, or to connect said second terminal of said second switching member to AC ground potential.

This embodiment is particularly beneficial in multichannel applications, which include more than two capacitive sensors and may comprise only one diagnostics current-to-voltage converter and one measurement current-to-voltage converter for cost reasons. In this case, time of operational availability can be increased, as the capacitance measurement circuit can enable to set an AC potential of the sense electrodes of the capacitive sensors to AC ground potential even if a respective capacitive sensor is not connected to either the measurement current-to-voltage converter or to the diagnostics current-to-voltage converter.

Preferably, the current measurement circuit comprises, for each capacitive sensor, a diagnostics output port that is electrically connected to a sense electrode of the capacitive sensor. With a capacitive sensor in the diagnostic switching state, the diagnostics output port can provide a complex electrical signal for further diagnosis.

In such embodiments, the current measurement circuit may further comprise means, for each capacitive sensor, to keep the diagnostics output port at guard potential of the respective capacitive sensor, which can beneficially eliminate a systematic error of measurement due to the diagnostics output port being connected to the sense electrode of the capacitive sensor.

In preferred embodiments of the capacitance measurement circuit, the remotely controllable switching unit forms part of a microcontroller, by which a reliable and simple remote control of the remotely controllable switching unit and, in this way, a reliable diagnosis of a capacitive sensor can be enabled. Microcontrollers that are suitably equipped and include, for instance, a processor unit, a digital memory unit, a microcontroller system clock, a demultiplexer unit and analog-to-digital converters are nowadays readily available in many variations.

Preferably, the remotely controllable switching unit is configured to periodically switch, for each capacitive sensor and in a manner that is coordinated among the capacitive sensors, between a measurement switching state and a diagnostic switching state. In this way, reliable operation of the capacitance measurement circuit can be accomplished.

In another aspect of the invention, a capacitive sensing system is provided. The capacitive sensing system includes an embodiment of the capacitance measurement circuit disclosed herein, a switch remote control unit and a plurality of capacitive sensors.

The switch remote control unit is configured for remotely controlling the remotely controllable switching unit. Each capacitive sensor of the plurality of capacitive sensors includes at least one electrically conductive sense electrode and at least one electrically conductive guard electrode that are arranged close to each other. As stated above, the at least one electrically conductive sense electrode and at least one electrically conductive guard electrode may be mutually galvanically separated from each other, but this is not a requirement. For example, a resistive connection between sense and guard electrodes can be used for diagnostics purpose.

The capacitance measurement circuit comprises one alternating signal voltage source that is configured for providing an alternating measurement voltage at an output port, wherein each guard electrode is electrically connected to the output port for receiving the alternating measurement voltage.

The current measurement circuit includes one measurement channel with one measurement current-to-voltage converter that is configured to determine, one at a time and with reference to the measurement voltage, a measurement current through a sense electrode of one of the plurality of capacitive sensors that is indicative of a position of an object relative to the respective capacitive sensor.

The current measurement circuit further comprises a plurality of diagnostics channels, each one being configured to determine, with reference to an AC ground potential, a diagnostic current flowing through a guard electrode and a sense electrode of a different one of the plurality of capacitive sensors.

In this way, a capacitive sensing system with reliable operation and a high percentage of operational availability can be accomplished, including the benefits that have been described beforehand in context with the disclosed capacitance measurement circuit.

Preferably, the switch remote control unit forms part of a microcontroller, by which a reliable and simple remote control of the remotely controllable switching unit and, in this way, a reliable diagnosis of a capacitive sensor can be enabled. Most preferred, both the switch remote control unit and the remotely controllable switching unit form part of the same microcontroller. In that way, short control paths between the switch remote control unit and the remotely controllable switching unit can be achieved, which are less susceptible to electromagnetic interference.

In the preferred embodiments, the capacitive sensing system further includes a signal processing unit that is configured for processing at least one out of an output signal of the measurement current-to-voltage converter with reference to the alternating measurement voltage and an output signal of the diagnostics current-to-voltage converter with reference to the alternating measurement voltage. In this way, an improved signal-to-noise ratio (SNR) can be achieved for the output signal of the measurement current-to-voltage converter and/or the output signal of the diagnostics current-to-voltage converter.

Further improvement of the SNR can be achieved if the capacitive sensing system includes a demodulation circuit that is configured for demodulating at least one out of an input signal of the measurement current-to-voltage converter with reference to the alternating measurement voltage and an input signal of the diagnostics current-to-voltage converter with reference to the alternating measurement voltage.

In case that the demodulation circuit is configured for demodulating the input signal of the measurement current-to-voltage converter, the demodulation circuit is preferably connected to the signal input port of the measurement current-to-voltage converter and the remotely controllable switching unit is accordingly configured to electrically connect the sense electrode of the capacitive sensor to the demodulation circuit.

In yet another aspect of the invention, a method of operating the capacitive sensing system disclosed herein with regard to capacitive sensor diagnosis is provided.

The method at least comprises steps of
controlling the remotely controllable switching unit to electrically disconnect the sense electrode of a capacitive sensor to be diagnosed from the signal input port of the measurement current-to-voltage converter,
controlling the remotely controllable switching unit to electrically connect the sense electrode of the capacitive sensor to be diagnosed to the signal input port of the diagnostics current-to-voltage converter,
controlling the remotely controllable switching unit to electrically connect the sense electrode of another capacitive sensor to the signal input port of the measurement current-to-voltage converter and to disconnect the sense electrode of this capacitive sensor from guard potential or from AC ground potential,
controlling the remotely controllable switching unit to electrically connect the sense electrodes of the remainder of the plurality of capacitive sensors to AC ground potential,
determining a sense current value through the sense electrode of the capacitive sensor to be diagnosed by the diagnostics current-to-voltage converter,
comparing the determined sense current value with at least one predetermined threshold value,
generating an output signal that is indicative of a sensor interruption if the determined sense current value is smaller than the predetermined threshold value.

In preferred embodiments of the method, the steps are executed and repeated in a periodic manner after swapping to a next capacitive sensor of the plurality of capacitive sensors to be diagnosed for each cycle of steps until all capacitive sensors of the plurality of capacitive sensors are diagnosed.

In yet another aspect of the invention, a software module for controlling automatic execution of steps of an embodiment of the method disclosed herein is provided.

The method steps to be conducted are converted into a program code of the software module, wherein the program code is implementable in a non-transitory computer-readable medium such as a digital memory unit of the capacitive sensing system or of a separate control unit and is executable by a processor unit of the capacitive sensing system or of a separate control unit.

The software module can enable a robust and reliable execution of the method and can allow for a fast modification of method steps.

These and other aspects of the invention will be apparent from and elucidated with reference to the embodiments described hereinafter.

It shall be pointed out that the features and measures detailed individually in the preceding description can be combined with one another in any technically meaningful manner and show further embodiments of the invention. The description characterizes and specifies the invention in particular in connection with the figures.

BRIEF DESCRIPTION OF THE DRAWINGS

Further details and advantages of the present invention will be apparent from the following detailed description of not limiting embodiments with reference to the attached drawing, wherein.

DETAILED DESCRIPTION

Figure 1:
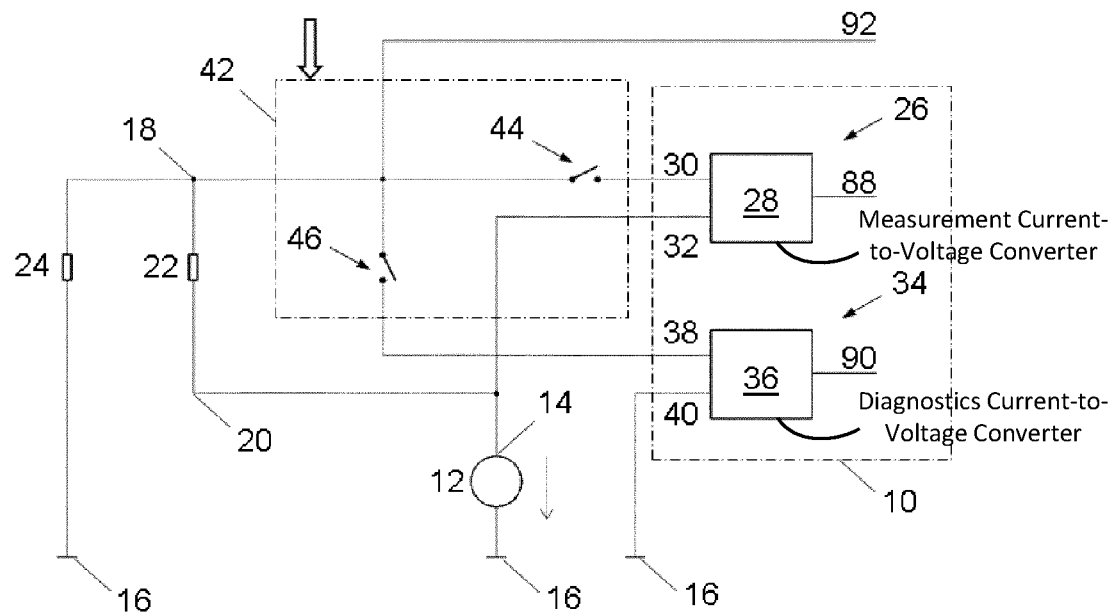
FIG. 1 illustrates an electric equivalent circuit diagram of a possible embodiment of a single-channel capacitance measurement circuit in accordance with the invention.

In the different figures, the same parts are always provided with the same reference numerals. Therefore, these parts are usually described only once.

FIG. 1 schematically illustrates an electric equivalent circuit diagram of a possible embodiment of a single-channel capacitance measurement circuit 100 in accordance with the invention. The capacitance measurement circuit 100 serves for determining a complex electric current of a single capacitive sensor configured in loading mode that includes an electrically conductive sense electrode and an electrically conductive guard electrode that are arranged close to each other, and that are mutually galvanically separated from each other. The sense electrode and a respective sense wiring resistance are represented in FIG. 1 by a sense node 18, and the guard electrode and a respective guard wiring resistance are represented by a guard node 20. A sense-to-guard impedance 22, which is substantially of capacitive nature, is electrically connected between the sense node 18 and the guard node 20. In this specific embodiment, the sense-to-guard impedance 22 may have a capacitance of about 1 nF, but capacitive sensors with a higher or lower sense-to-guard capacitance are also contemplated.

The single-channel capacitance measurement circuit 100 includes an alternating, namely sinusoidal, signal voltage source 12 that is configured for providing an alternating measurement voltage at an output port 14 with respect to an AC ground potential 16. The guard electrode is electrically connected to the alternating signal voltage source 12 for receiving the alternating measurement voltage, from where it is transferred to the guard node 20.

The single-channel capacitance measurement circuit 100 includes a current measurement circuit 10 that comprises a measurement channel 26 including a measurement current-to-voltage converter 28 and a diagnostics channel 34 including a diagnostics current-to-voltage converter 36. Both the measurement current-to-voltage converter 28 and the diagnostics current-to-voltage converter 36 comprise a transimpedance amplifier (TIA), whose function is to convert a complex electric current provided at a signal input port 30, 38 into an output voltage that is proportional to the determined sense current. Both the TIAs are configured to convert the sense current with reference to a reference voltage that is provided to a reference input port 32, 40. The reference input port 32 of the measurement current-to-voltage converter 28 is electrically connected to the output port 14 of the signal voltage source 12. The reference input port 40 of the diagnostics current-to-voltage converter 36 is electrically connected to AC ground potential 16.

Thus, the measurement current-to-voltage converter 28 is configured to determine, with reference to the measurement voltage, a measurement current through the sense electrode that is indicative of a position of an object relative to the capacitive sensor. An object approaching the sense electrode is represented in the electric equivalent circuit diagram of FIG. 1 by an unknown impedance 24 that is connected to AC ground potential 16, which for instance may be a vehicle ground potential. If the grounded object approaches the sense electrode, the unknown impedance 24 changes in that at least its capacitive portion increases, and the measurement current flowing between the sense electrode and ground potential and, by that, an amplitude of the TIA output voltage signal is increased, indicating a closer proximity of the object to the capacitive sensor.

The diagnostics current-to-voltage converter 36 is configured to determine, with reference to AC ground potential 16, a diagnostic current flowing through the guard electrode and the sense electrode of a capacitive sensor when connected to the diagnostics current-to-voltage converter 36.

Furthermore, the capacitance measurement circuit 100 includes a switching unit 42 that is remotely controllable by a switch remote control unit (not shown). The switching unit 42 comprises a plurality of two operatively coupled switching members 44, 46. The switching members 44, 46 are operatively coupled in that the one switching member 44 changes a switching position from open to closed while the other switching member 46 changes the switching position from closed to open and vice versa.

A first one 44 of the switching members 44, 46 is positioned between the sense node 18 and the signal input port 30 of the measurement current-to-voltage converter 28. A second one 46 of the switching members 44, 46 is positioned between the sense node 18 and the signal input port 38 of the diagnostics current-to-voltage converter 36.

In a measurement switching state with regard to the capacitive sensor, the switching unit 42 is configured to electrically connect the sense electrode of the capacitive sensor to the signal input port 30 of the measurement current-to-voltage converter 28 by controlling the first switching member 44 into a closed switching state. At the same time, the second switching member 46 is controlled into an open switching state. The measurement current-to-voltage converter 28 measures the unknown current flowing through the unknown impedance 24. The voltage at an output port 88 of the measurement current-to-voltage converter 28 is indicative of the unknown impedance 24 and can be measured, recorded and evaluated. If necessary, a signal processing circuit, for example a synchronous rectifier and lowpass filter, may be inserted between the output port 88 of the measurement current-to-voltage converter 28 and an evaluation unit (not shown).

It is noted that AC coupling capacitors or impedances for limiting electric currents during a potential sensor short circuit to any external nodes or in case of an ESD (electrostatic discharge) event can be inserted in series with most of the members of the capacitance measurement circuit 100.

In a diagnostic switching state with regard to the capacitive sensor, the switching unit 42 is configured to electrically connect the sense electrode to a signal input port 38 of the diagnostics current-to-voltage converter 36 by controlling the second switching member 46 into a closed switching state. At the same time, the first switching member 44 is controlled into an open switching state. In the diagnostic switching state, the sense electrode is kept at or close to AC ground potential, and, simultaneously, the sense node AC ground level and the sense-to-guard impedance 22 of the capacitive sensor can be diagnosed as follows.

The diagnostics current-to-voltage converter 36 is measuring a current flowing from the signal voltage source 12 through the guard node 20, the sense-to-guard impedance 22, the sense node 18 and the second switching member 46, and into the signal input port 38 of the diagnostics current-to-voltage converter 36. The output voltage at an output port 90 of the diagnostics current-to-voltage converter 36 can be measured, recorded and evaluated. If necessary, a signal processing circuit, for example a synchronous rectifier and lowpass filter, may be inserted between the output port 90 of the diagnostics current-to-voltage converter 36 and an evaluation unit (not shown). Furnished with an evaluation unit, the capacitance measurement circuit 100 is configured to generate an output signal that is indicative of a sensor interruption if the magnitude of a determined diagnostic current flowing through the sense electrode and the guard electrode of the capacitive sensor is less than a predefined threshold value.

As the voltage of the signal voltage source 12 is known a priori, the sense-to-guard impedance 22 can be calculated. As the reference input port 40 of the diagnostics current-to-voltage converter 36 is grounded, the sense node 18 is also grounded. As the diagnostics current-to-voltage converter 36 measures the current into its signal input port 38, a quantitative statement can also be made with regard to sense electrode AC ground level diagnostics: If no electric current is detected, there is an issue within the measurement path, which may lead to the sense electrode not being properly connected to AC ground potential 16. The current measurement circuit 100 comprises a diagnostics output port 92 that is electrically connected to the sense electrode of the capacitive sensor. If desired, a more precise diagnostic can be applied by measuring the voltage at the diagnostics output port 92, which is equal to the voltage at the sense node 18.

In the following, other embodiments of capacitance measurement circuits in accordance with the invention and of capacitive sensing systems comprising such capacitance measurement circuit will be described with reference to FIGS. 2 to 6. In order to avoid unnecessary repetition, only differences to a respective preceding embodiment will be described.

Figure 2:
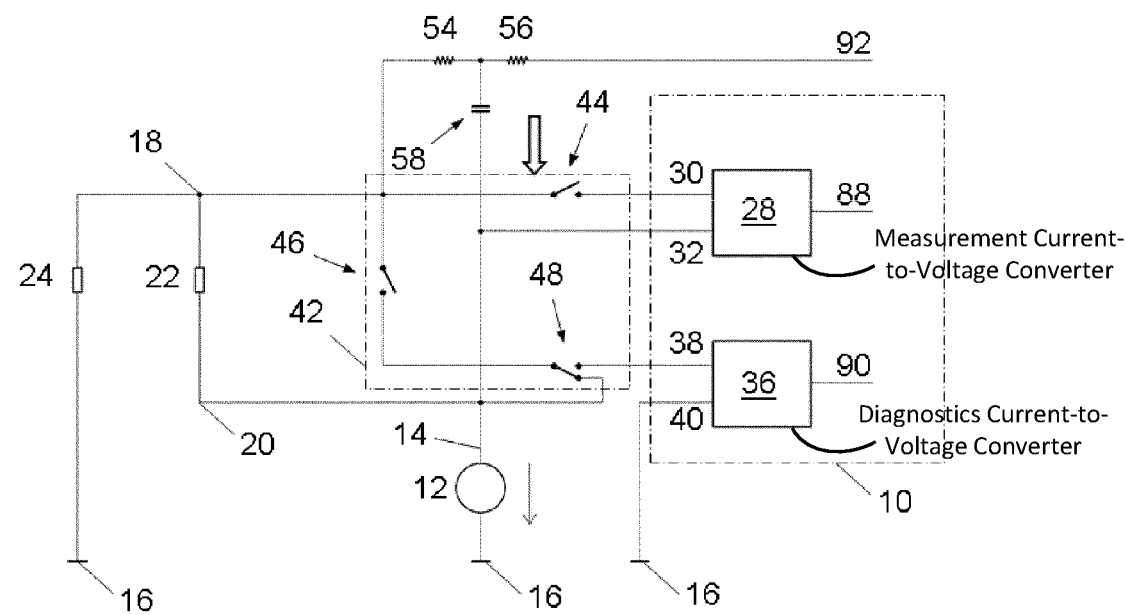
FIG. 2 illustrates an electric equivalent circuit diagram of an alternative embodiment of a single-channel capacitance measurement circuit in accordance with the invention.

FIG. 2 illustrates an electric equivalent circuit diagram of an alternative embodiment of a single-channel capacitance measurement circuit 200 in accordance with the invention. The single-channel capacitance measurement circuit 200 comprises two modifications compared to the embodiment as shown in FIG. 1.

For the connected capacitive sensor, a demultiplexer member 48 is provided in the remotely controllable switching unit 42. The remotely controllable switching unit 42 is configured, by controlling the demultiplexer member 48 and in the measurement switching state with regard to the capacitive sensor, to keep a terminal of the switching member 46 for electrically connecting the sense electrode to the signal input port 38 of the diagnostics current-to-voltage converter 36 at the converter end to guard potential of the capacitive sensor. This prevents introducing a measurement error by a parasitic capacitance of the switching member 46, as a voltage difference across terminals of the switching member 46 is virtually reduced to 0 V.

In a diagnostic switching state with regard to the capacitive sensor, the remotely controllable switching unit 42 is configured, by controlling the demultiplexer member 48, to connect the terminal of the switching member 46 at the converter end to the signal input port 38 of the diagnostics current-to-voltage converter 36.

Moreover, the current measurement circuit 200 comprises means, for each capacitive sensor, to keep the diagnostics output port 92 at guard potential of the respective capacitive sensor, which can beneficially eliminate a systematic error of measurement due to the diagnostics output port 92 being connected to the sense electrode of the capacitive sensor. In this particular embodiment, the means comprise two resistors 54, 56 and a capacitor 58 arranged in a T configuration.

Figure 3:
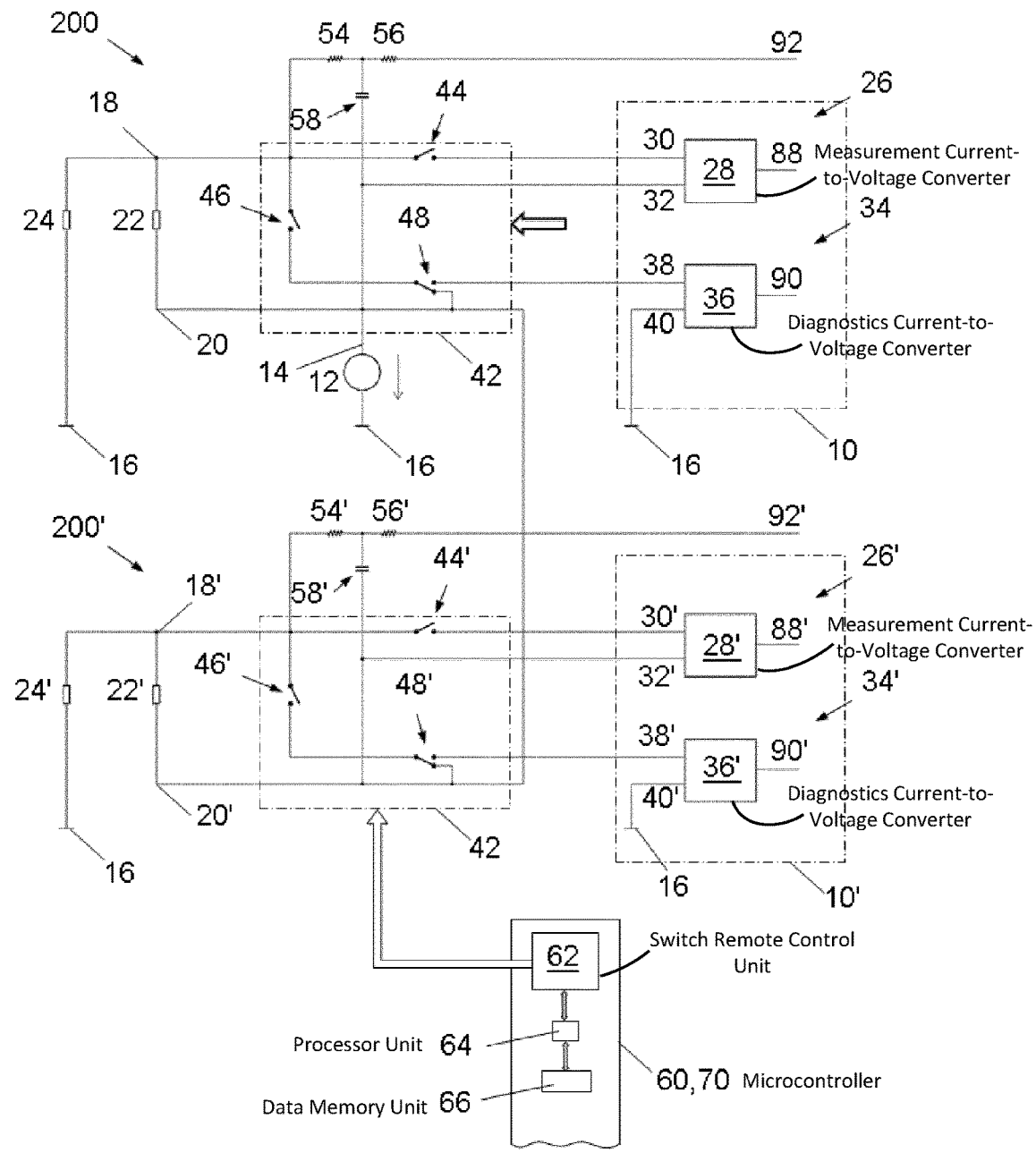
FIG. 3 illustrates an electric equivalent circuit diagram of a possible embodiment of a multichannel capacitive sensing system in accordance with the invention.

FIG. 3 illustrates an electric equivalent circuit diagram of a possible embodiment of a multichannel capacitive sensing system 300 in accordance with the invention, comprising a plurality of two capacitive sensors. The multichannel capacitive sensing system 300 includes a capacitance measurement circuit 200 pursuant to FIG. 2, and a duplicated version 200' of this capacitance measurement circuit 200, wherein the alternating signal voltage source 12 is common to both capacitance measurement circuits 200, 200'. In other embodiments, each of the capacitance measurement circuits may include a alternating signal voltage source of its own. Each capacitance measurement circuit 200, 200' includes one measurement channel 26, 26' and one diagnostics channel 34, 34' for each one of the two capacitive sensors.

The multichannel capacitive sensing system 300 includes a microcontroller 60, and the remotely controllable switching unit 42 forms part of the microcontroller. In turn, the microcontroller 60 comprises a switch remote control unit 62 that is configured for remotely controlling the remotely controllable switching unit 42.

The microcontroller 60 comprises a processor unit 64, a digital data memory unit 66 that comprises a non-transitory computer-readable medium to which the processor unit 64 has data access, and a plurality of analog-to-digital converters (ADCs, not shown), and is also employed to serve as an evaluation unit 70.

The remotely controllable switching unit 42 is configured, by control of the switch remote control unit 62, to control the switching members 44, 44', 46, 46' such that each capacitive sensor is connected either in the measurement switching state or in the diagnostic switching state.

The remotely controllable switching unit 42 is further configured, by control of the switch remote control unit 62, to periodically switch, for each capacitive sensor and in a manner that is coordinated among the capacitive sensors, between the measurement switching state and the diagnostic switching state.

Although in this particular embodiment the multichannel capacitive sensing system 300 includes a plurality of two capacitive sensors, it is also contemplated that the multichannel capacitive sensing system 300 may include a plurality of more than two capacitive sensors.

Figure 4:
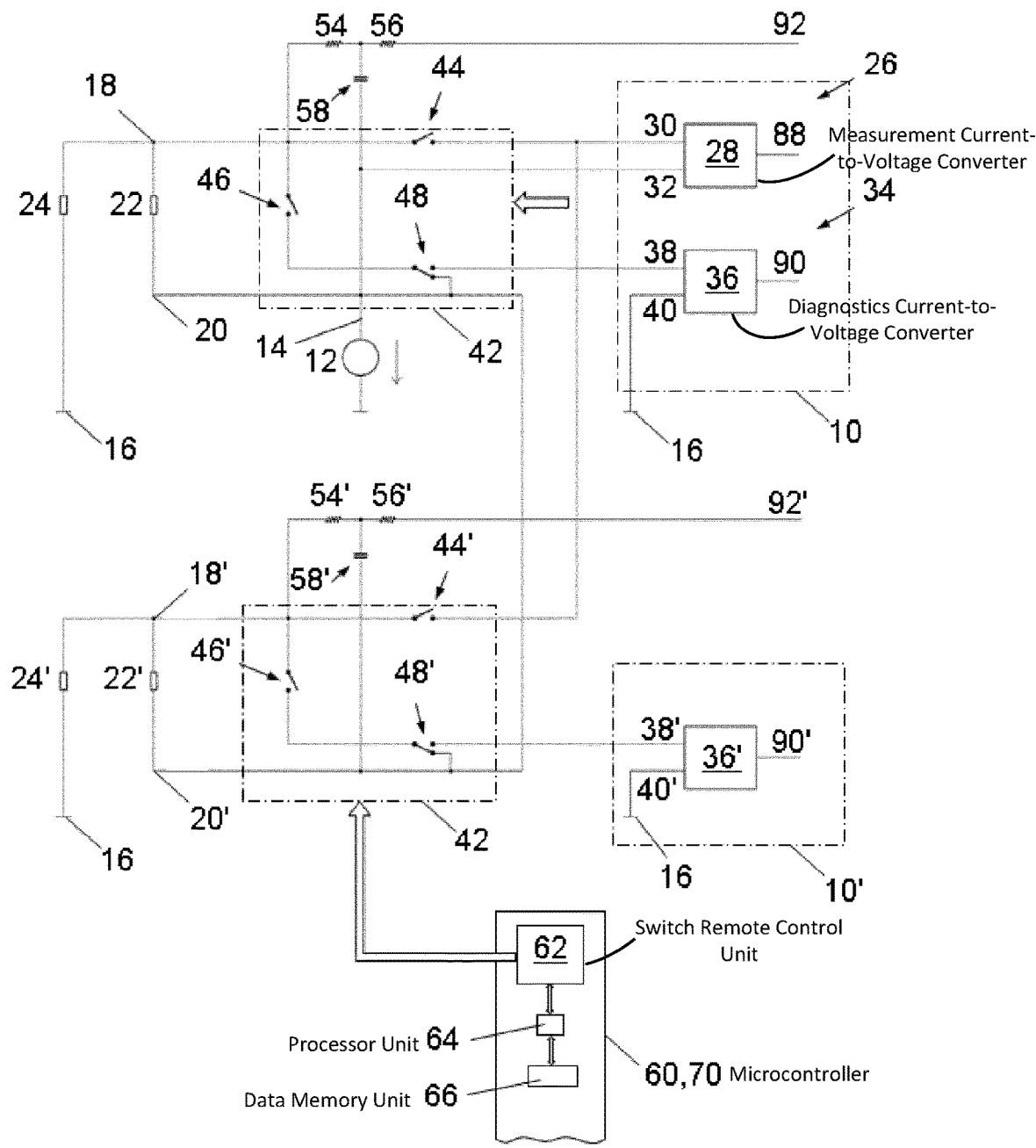
FIGS. 4-6 illustrate electric equivalent circuit diagrams of alternative possible embodiments of a multichannel capacitive sensing system in accordance with the invention.

FIG. 4 illustrates an electric equivalent circuit diagram of an alternative possible embodiments of a multichannel capacitive sensing system 400 in accordance with the invention. The difference of the multichannel capacitive sensing system 400 compared to the multichannel capacitive sensing system 300 pursuant to FIG. 3 is that there is only one measurement current-to-voltage converter 28.

In multichannel multiplexed measurement applications, time is neither lost by the sense-to-guard diagnostics nor by the sense electrode AC ground level diagnostics. Usually, the measurement current-to-voltage converter 28 and associated processing circuit is more expensive than the diagnostics current-to-voltage converter 36 due to the required measurement accuracy, which is lower for the diagnostics current-to-voltage converter 36. Therefore, only one measurement current-to-voltage converter 28 is used in the multichannel capacitive sensing system 400 pursuant to FIG. 4, while there is one diagnostics current-to-voltage converter 36, 36' per capacitive sensor. The switching configuration is the same as for the multichannel capacitive sensing system 300 pursuant to FIG. 3, except that the remotely controllable switching unit 42 is configured, controlled by the switch remote control unit 62, to only put one capacitive sensor into a measurement switching state at the same time. As the diagnostics can be executed for each capacitive sensor which is currently not measuring, in parallel to the measurement, the diagnostics does not add time to a required total measurement time.

Figure 5:
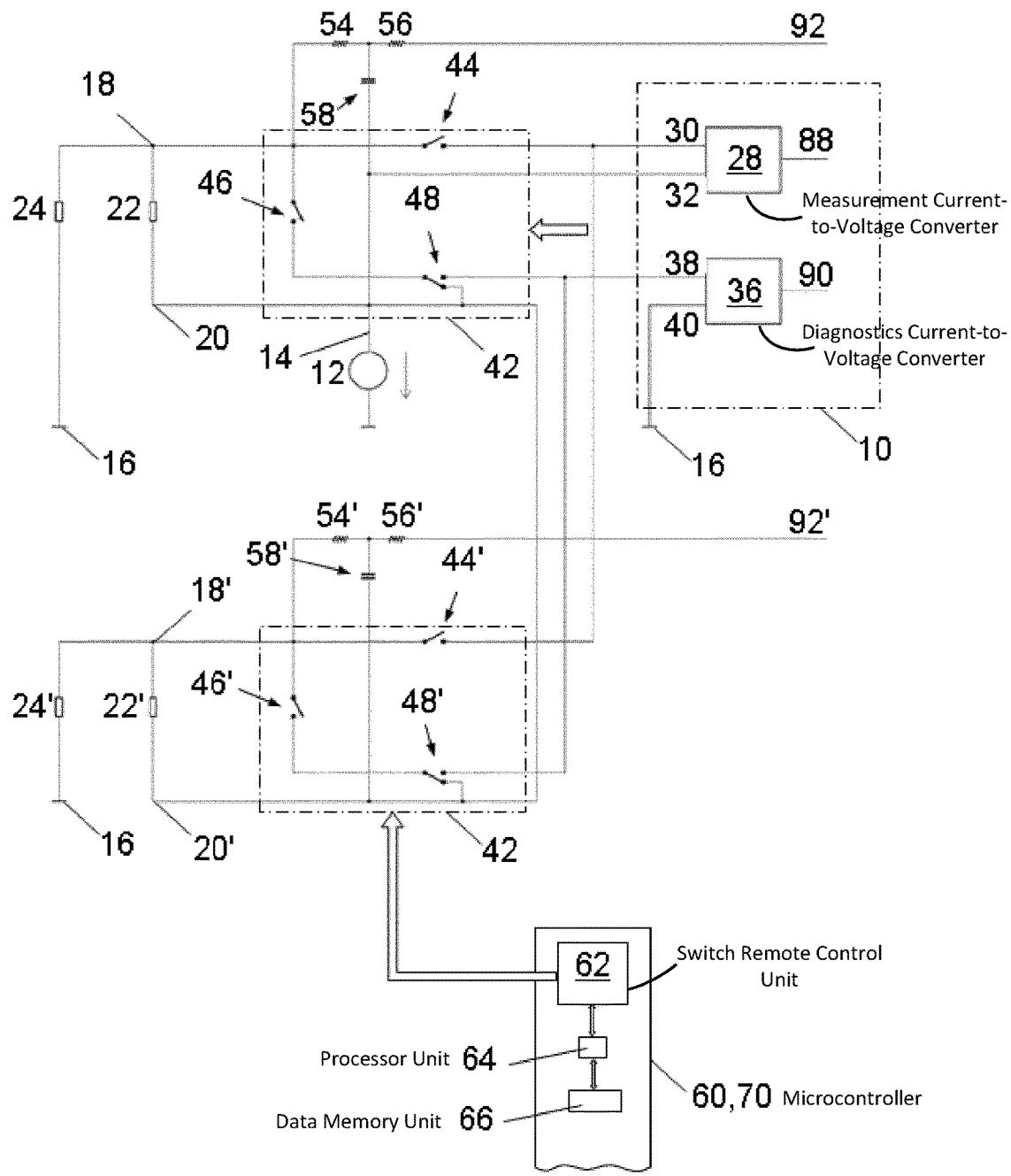

FIG. 5 illustrates an electric equivalent circuit diagram of another alternative possible embodiments of a multichannel capacitive sensing system 500 in accordance with the invention. The difference of the multichannel capacitive sensing system 500 compared to the multichannel capacitive sensing system 400 pursuant to FIG. 4 is that there is only one measurement current-to-voltage converter 28 and only one diagnostics current-to-voltage converter 36.

This embodiment is cost-efficient, however, for more than two capacitive sensors, a case that is contemplated as well, the remotely controllable switching unit 42 has to be configured, controlled by the switch remote control unit 62, to only put one capacitive sensor into a diagnostic switching state at the same time, leaving the sense nodes 18, 18' of the other capacitive sensors at guard potential. Consequently, time is lost by not being able to perform measurements and diagnostics at the same time.

Figure 6:
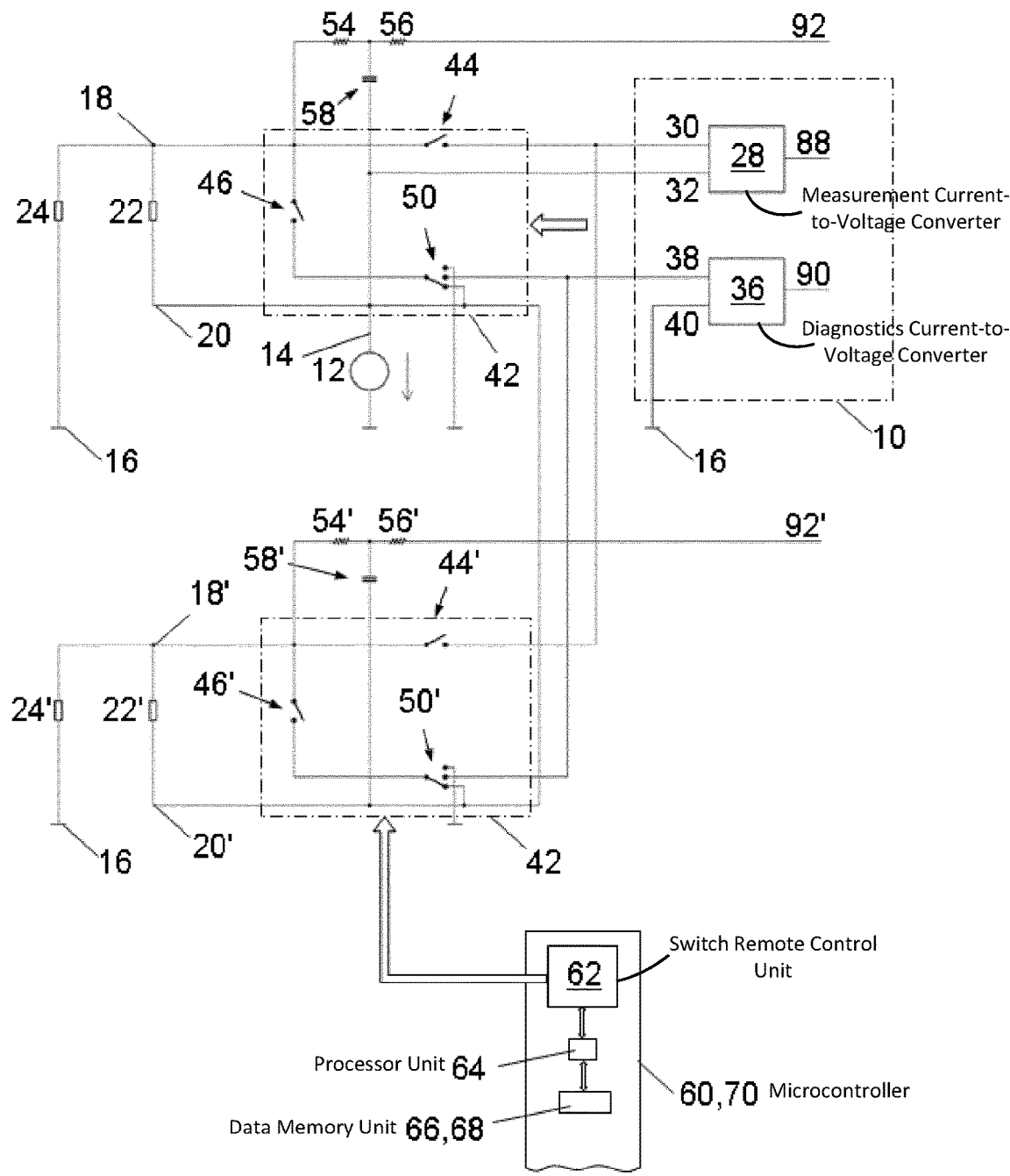

FIG. 6 illustrates an electric equivalent circuit diagram of another alternative possible embodiments of a multichannel capacitive sensing system 600 in accordance with the invention. The difference of the multichannel capacitive sensing system 600 compared to the multichannel capacitive sensing system 500 pursuant to FIG. 5 is that a demultiplexer member 50, 50' that is provided in the remotely controllable switching unit 42 for each capacitive sensor comprises an additional terminal.

In a measurement switching state with regard to a respective capacitive sensor, each one of the demultiplexer members 50, 50' having an additional terminal is configured to keep the terminal of the switching member 46, 46' for electrically connecting the sense electrode to a signal input port 38 of the diagnostics current-to-voltage converter 36 at the converter end at guard potential of the respective capacitive sensor.

Further, for each capacitive sensor whose sense electrode is unconnected to the signal input port 30 of the measurement current-to-voltage converter 28, the demultiplexer members 50, 50' are configured to either connect the terminal of the switching member 46, 46' for electrically connecting the sense electrode to a signal input port 38 of the diagnostics current-to-voltage converter 36 at the converter end to guard potential of the capacitive sensor, or to connect the terminal of the switching member 46, 46' for electrically connecting the sense electrode to the signal input port 38 of the diagnostics current-to-voltage converter 36 at the converter end to AC ground potential 16.

By that, a remedy is provided for a loss in operational availability existing for the capacitive sensing system 500 pursuant to FIG. 5 in a case of more than two capacitive sensors, and high operational availability can be achieved despite the hardware saving.

Figure 7:
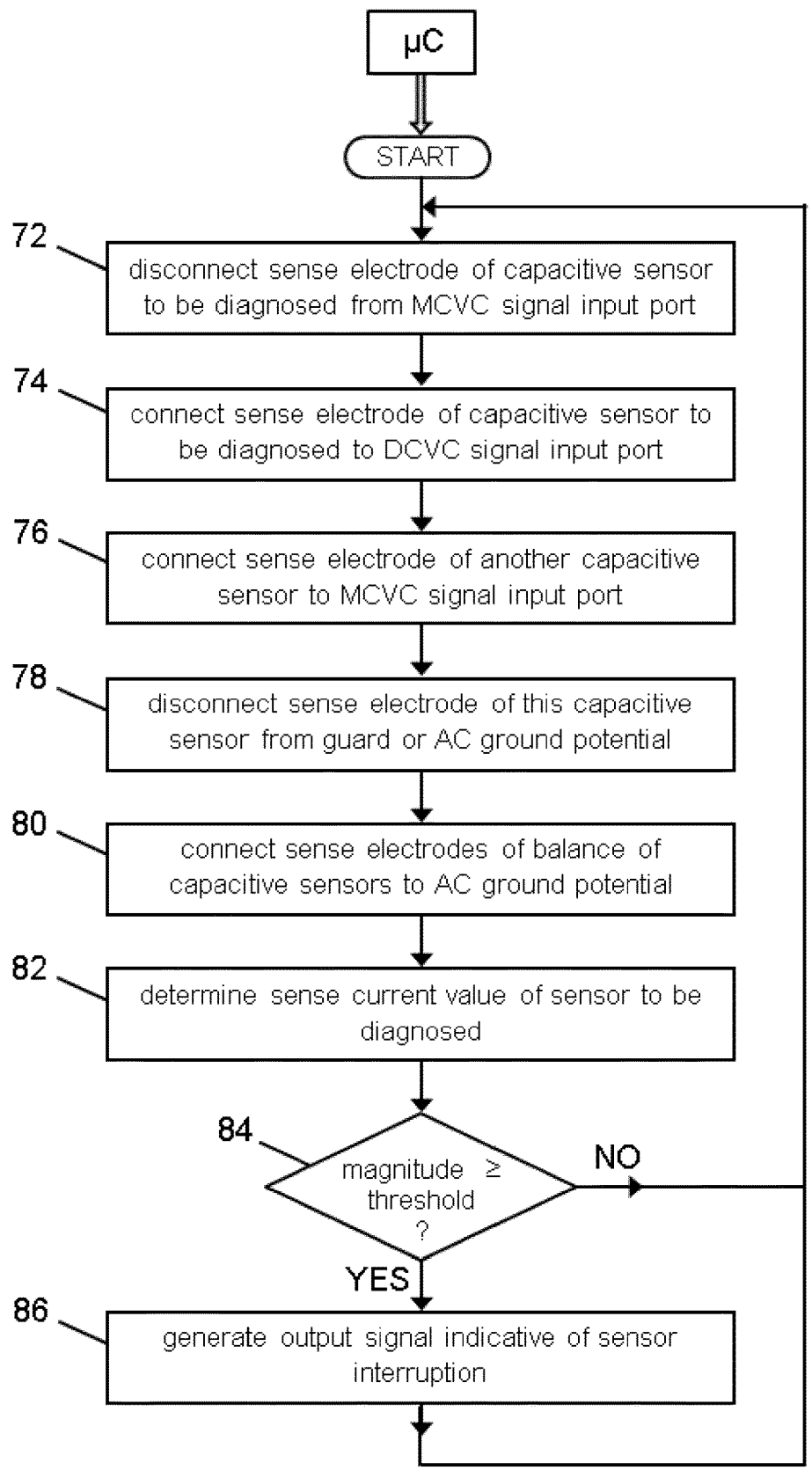
FIG. 7 is a flow chart of a method of operating the capacitive sensing system pursuant to FIG. 6.

In the following, an embodiment of a method of operating the capacitive sensing system 600 pursuant to FIG. 6 with regard to capacitive sensor diagnosis will be described. A flowchart of the method is given in FIG. 7. In preparation of using the capacitive sensing system 600, it shall be understood that all involved units and devices are in an operational state and configured as illustrated in FIG. 6.

The microcontroller 60 is furnished with a software module 68 for controlling automatic execution of steps of the method. Steps to be conducted are converted into a program code of the software module, wherein the program code is implementable in the digital data memory unit 66 of the microcontroller 60 and is executable by the processor unit 64 of the microcontroller 60.

In a first step 72 of the method, the remotely controllable switching unit 42 is controlled by the switch remote control unit 62 to electrically disconnect the sense electrode of a capacitive sensor to be diagnosed from the signal input port 30 of the measurement current-to-voltage converter 28. At substantially the same time and in an immediately following step 74, the remotely controllable switching unit 42 is controlled by the switch remote control unit 62 to electrically connect the sense electrode of the capacitive sensor to be diagnosed to the signal input port 38 of the diagnostics current-to-voltage converter 36.

Then, in another step 76, the remotely controllable switching unit 42 is controlled by the switch remote control unit 62 to electrically connect the sense electrode of another capacitive sensor to the signal input port 30 of the measurement current-to-voltage converter 28 and, in an immediately following step 78, to disconnect the sense electrode of this capacitive sensor from guard potential or from AC ground potential 16.

The remotely controllable switching unit 42 is controlled by the switch remote control unit 62 to electrically connect the sense electrodes of the remainder of the plurality of capacitive sensors to AC ground potential 16 in a further step 80. Then, in a further step 82, a complex sense current value through the sense electrode of the capacitive sensor to be diagnosed is determined by the diagnostics current-to-voltage converter 36. After that, the determined sense current value is compared with a predetermined threshold value by the microcontroller 60 serving as the evaluation unit 70 in a next step 84. An output signal that is indicative of a sensor interruption is generated in another step 86 if the magnitude of the determined sense current value is smaller than the predetermined threshold value.

After a step of swapping, for each cycle of steps, to a next capacitive sensor of the plurality of capacitive sensors that is to be diagnosed, the above-described steps are executed and repeated in a periodic manner until all capacitive sensors are diagnosed.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality, which is meant to express a quantity of at least two. The mere fact that certain measures are recited in mutually different dependent claims does not indicate that a combination of these measures cannot be used to advantage. Any reference signs in the claims should not be construed as limiting scope.

The invention claimed is:

1. A capacitance measurement circuit for determining a complex electric current of at least one capacitive sensor including at least one electrically conductive sense electrode and at least one electrically conductive guard electrode that are arranged close to each other, the capacitance measurement circuit comprising:
   at least one alternating signal voltage source that is configured for providing an alternating measurement voltage at an output port, wherein each guard electrode is electrically connected to the output port of the at least one alternating signal voltage source for receiving the alternating measurement voltage,
   a current measurement circuit comprising at least one measurement channel including a measurement current-to-voltage converter that is configured to determine, with reference to the alternating measurement voltage, a measurement current through a sense electrode that is indicative of a position of an object relative to the capacitive sensor, and at least one diagnostics channel including a diagnostics current-to-voltage converter that is configured to determine, with reference to an AC ground potential (alternating current ground potential), a diagnostic current flowing through a guard electrode and a sense electrode of a capacitive sensor that is connected to the diagnostics current-to-voltage converter, and a remotely controllable switching unit comprising, for each capacitive sensor, a plurality of operatively coupled switching members, wherein in a measurement switching state with regard to the capacitive sensor, the switching unit is configured to electrically connect the sense electrode of the capacitive sensor to a signal input port of the measurement current-to-voltage converter of the at least one measurement channel and wherein in a diagnostic switching state with regard to the capacitive sensor, the switching unit is configured to electrically connect the sense electrode to a signal input port of the diagnostics current-to-voltage converter of the at least one measurement channel.

2. The capacitance measurement circuit as claimed in claim 1, wherein the capacitance measurement circuit is configured to generate an output signal that is indicative of a sensor interruption if the magnitude of a determined diagnostic current flowing through a sense electrode and a guard electrode of a capacitive sensor that is connected to the diagnostics current-to-voltage converter is less than a predefined threshold value.

3. The capacitance measurement circuit as claimed in claim 1, wherein, for each capacitive sensor,
  a first switching member of said plurality of operatively coupled switching members is configured to, in the measurement switching state with regard to the capacitive sensor, electrically connect the sense electrode of the capacitive sensor to the signal input port of the measurement current-to-voltage converter;
  a second switching member of said plurality of operatively coupled switching members is configured to, in the diagnostic switching state with regard to the capacitive sensor, electrically connect the sense electrode to the signal input port of the diagnostics current-to-voltage converter said second switching member comprising a first terminal and a second terminal, wherein, in the diagnostic switching state with regard to the capacitive sensor, the first terminal of said second switching member is operatively coupled to the sense electrode and said second terminal of said second switching member is operatively coupled to the signal input port (38) of the diagnostics current-to-voltage converter, and
  said switching unit comprises a demultiplexer member, said demultiplexer member being configured, in the measurement switching state with regard to a respective capacitive sensor, to connect said second terminal of said second switching member to a potential of a guard electrode (guard potential) of the respective capacitive sensor.

4. The capacitance measurement circuit as claimed in claim 1, wherein, for each capacitive sensor:
  a first switching member of said plurality of operatively coupled switching members is configured to, in the measurement switching state with regard to the capacitive sensor, electrically connect the sense electrode of the capacitive sensor to the signal input port of the measurement current-to-voltage converter;
  a second switching member of said plurality of operatively coupled switching members is configured to, in the diagnostic switching state with regard to the capacitive sensor, electrically connect the sense electrode to the signal input port of the diagnostics current-to-voltage converter, said second switching member comprising a first terminal and a second terminal, wherein, in the diagnostic switching state with regard to the capacitive sensor, the first terminal of said second switching member is operatively coupled to the sense electrode and said second terminal of said second switching member is operatively coupled to the signal input port of the diagnostics current-to-voltage converter, and
  said switching unit comprises a demultiplexer member, said demultiplexer member being configured,
    in the measurement switching state with regard to a respective capacitive sensor, to connect said second terminal of said second switching member to a potential of a guard electrode (guard potential) of the respective capacitive sensor
  and
    for each capacitive sensor whose sense electrode is unconnected to a measurement current-to-voltage converter, to either connect said second terminal of said second switching member to guard potential of the capacitive sensor, or to connect said second terminal of said second switching member to AC ground potential.

5. The capacitance measurement circuit as claimed in claim 1, wherein the current measurement circuit comprises, for each capacitive sensor, a diagnostics output port that is electrically connected to a sense electrode of the capacitive sensor.

6. The capacitance measurement circuit as claimed in claim 5, wherein the current measurement circuit comprises means, for each capacitive sensor, to keep the diagnostics output port at guard potential of the respective capacitive sensor.

7. The capacitance measurement circuit as claimed in claim 1, wherein the remotely controllable switching unit forms part of a microcontroller.

8. The capacitance measurement circuit as claimed in claim 1, wherein the remotely controllable switching unit is configured to periodically switch, for each capacitive sensor and in a manner that is coordinated among the capacitive sensors, between a measurement switching state and a diagnostic switching state.

9. A capacitive sensing system including:
  a capacitance measurement circuit as claimed in claim 1,
  a switch remote control unit-that is configured for remotely controlling the remotely controllable switching unit, and
  a plurality of capacitive sensors, each capacitive sensor including at least one electrically conductive sense electrode and at least one electrically conductive guard electrode that are arranged close to each other, wherein each guard electrode is electrically connected to the output port of the alternating signal voltage source for receiving the alternating measurement voltage,
and wherein
  the current measurement circuit comprises
    one measurement channel with one measurement current-to-voltage converter that is configured to determine, one at a time and with reference to the alternating measurement voltage, a measurement current through a sense electrode of one of the plurality of capacitive sensors that is indicative of a position of an object relative to the respective capacitive sensor, and
    one diagnostics channel with one diagnostics current-to-voltage converter that is configured to determine, with reference to an AC ground potential, a diagnostic current flowing through a guard electrode and a sense electrode of each capacitive sensor of the plurality of capacitive sensors.

10. The capacitive sensing system as claimed in claim 9, wherein the current measurement circuit comprises a plurality of diagnostics channels, each diagnostic channel including a diagnostics current-to-voltage converter that is configured to determine, with reference to an AC ground potential, a diagnostic current flowing through a guard electrode and a sense electrode of a different one of the plurality of capacitive sensors.

11. The capacitive sensing system as claimed in claim 9, wherein the switch remote control unit forms part of a microcontroller.

12. The capacitive sensing system as claimed in claim 9, further including a signal processing unit that is configured for processing at least one out of an output signal of the measurement current-to-voltage converter with reference to the alternating measurement voltage and an output signal of the diagnostics current-to-voltage converter with reference to the alternating measurement voltage.

13. The capacitive sensing system as claimed in claim 9, further including a demodulation circuit that is configured for demodulating at least one out of an input signal of the measurement current-to-voltage converter with reference to the alternating measurement voltage and an input signal of the diagnostics current-to-voltage converter with reference to the alternating measurement voltage.

14. A method of operating the capacitive sensing system as claimed in claim 9 with regard to capacitive sensor diagnosis, the method at least comprising steps of controlling the remotely controllable switching unit to electrically disconnect (72) the sense electrode of a capacitive sensor to be diagnosed from the signal input port of the measurement current-to-voltage converter, controlling the remotely controllable switching unit to electrically connect (74) the sense electrode of the capacitive sensor to be diagnosed to the signal input port of the diagnostics current-to-voltage converter, controlling the remotely controllable switching unit to electrically connect (76) the sense electrode of another capacitive sensor to the signal input port of the measurement current-to-voltage converter and to disconnect (78) the sense electrode of this capacitive sensor from guard potential or from AC ground potential, controlling the remotely controllable switching unit to electrically connect (80) the sense electrodes of the remainder of the plurality of capacitive sensors to AC ground potential, determining (82), by the diagnostics current-to-voltage converter, a sense current value through the sense electrode of the capacitive sensor to be diagnosed, comparing (84) the determined sense current value with at least one predetermined threshold value, and generating (86) an output signal that is indicative of a sensor interruption if the determined sense current value is smaller than the predetermined threshold value.

15. The method as claimed in claim 14, wherein the steps (72) to (86) are executed and repeated in a periodic manner after swapping, for each cycle of steps (72) to (86), to a next capacitive sensor of the plurality of capacitive sensors that is to be diagnosed until all capacitive sensors are diagnosed.

16. A software module for controlling automatic execution of steps of the method as claimed in claim 14, wherein method steps to be conducted are converted into a program code of the software module, wherein the program code is implementable in a digital data memory unit of the capacitive sensing system or of a separate control unit and is executable by a processor unit of the capacitive sensing system or of a separate control unit.

\* \* \* \* \*